(12) United States Patent
Chen et al.

(10) Patent No.: US 8,901,609 B1
(45) Date of Patent: Dec. 2, 2014

(54) TRANSISTOR HAVING DOPED SUBSTRATE AND METHOD OF MAKING THE SAME

(71) Applicant: Taiwan Semiconductor Manufacturing Company, Ltd., Hsinchu (TW)

(72) Inventors: Chi-Ming Chen, Zhubei (TW); Chih-Wen Hsiung, Hsinchu (TW); Ming-Chang Ching, Zhubei (TW); Chen-Hao Chiang, Jhongli (TW); Po-Chun Liu, Hsinchu (TW); Chung-Yi Yu, Hsinchu (TW); Chia-Shiung Tsai, Hsinchu (TW); Xiaomeng Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/944,494

(22) Filed: Jul. 17, 2013

(51) Int. Cl.
*H01L 29/778* (2006.01)
*H01L 29/66* (2006.01)

(52) U.S. Cl.
CPC ........ *H01L 29/778* (2013.01); *H01L 29/66431* (2013.01)
USPC .......................................... 257/194; 438/172

(58) Field of Classification Search
USPC .......................................................... 257/194
See application file for complete search history.

(56) References Cited

U.S. PATENT DOCUMENTS

| 7,112,830 | B2 | 9/2006 | Munns |
| 7,547,925 | B2 | 6/2009 | Wong et al. |
| 2007/0108456 | A1 | 5/2007 | Wong et al. |

OTHER PUBLICATIONS

Srivastava, P., et al., "Si Trench Around Drain (STAD) Technology of GaN-DHFETs on Si Substrate for Boosting Power Performance", IEEE, 2001.

*Primary Examiner* — Zandra Smith
*Assistant Examiner* — Lawrence Tynes, Jr.
(74) *Attorney, Agent, or Firm* — Lowe Hauptman & Ham, LLP (57) ABSTRACT

A transistor includes a substrate, wherein a top portion of the substrate is doped with p-type dopants to a dopant concentration ranging from about $1 \times 10^{18}$ ions/cm$^3$ to about $1 \times 10^{23}$ ions/cm$^3$. The transistor further includes a graded layer on the substrate and a channel layer on the graded layer. The transistor further includes an active layer on the channel layer, wherein the active layer has a band gap discontinuity with the channel layer.

20 Claims, 9 Drawing Sheets

TRANSISTOR HAVING DOPED SUBSTRATE AND METHOD OF MAKING THE SAME

RELATED APPLICATIONS

The instant application is related to the following U.S. Patent Applications:

U.S. Patent Application titled "TRANSISTOR HAVING PARTIALLY OR WHOLLY REPLACED SUBSTRATE AND METHOD OF MAKING THE SAME," U.S. application Ser. No. 13/944,779;

U.S. Patent Application titled "TRANSISTOR HAVING HIGH BREAKDOWN VOLTAGE AND METHOD OF MAKING THE SAME," U.S. application Ser. No. 13/944,713;

U.S. Patent Application titled "TRANSISTOR HAVING BACK-BARRIER LAYER AND METHOD OF MAKING THE SAME," U.S. application Ser. No. 13/944,584;

U.S. Patent Application titled "TRANSISTOR HAVING A BACK-BARRIER LAYER AND METHOD OF MAKING THE SAME," U.S. application Ser. No. 13/944,672;

U.S. Patent Application titled "TRANSISTOR HAVING OHMIC CONTACT BY GRADIENT LAYER AND METHOD OF MAKING SAME" U.S. application Ser. No. 14/010,268;

U.S. Patent Application titled "TRANSISTOR HAVING AN OHMIC CONTACT BY SCREEN LAYER AND METHOD OF MAKING THE SAME," U.S. application Ser. No. 14/010,220;

U.S. Patent Application titled "TRANSISTOR HAVING METAL DIFFUSION BARRIER AND METHOD OF MAKING THE SAME," U.S. application Ser. No. 13/948,925; and U.S. Patent Application titled "SEMICONDUCTOR DEVICE, HIGH ELECTRON MOBILITY TRANSISTOR (E-HEMT) AND METHOD OF MANUFACTURING," U.S. application Ser. No. 13/944,625.

The entire contents of the above-referenced applications are incorporated by reference herein.

BACKGROUND

In semiconductor technology, Group III-Group V (or III-V) semiconductor compounds are used to form various integrated circuit devices, such as high power field-effect transistors, high frequency transistors, high electron mobility transistors (HEMTs), or metal-insulator-semiconductor field-effect transistors (MISFETs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
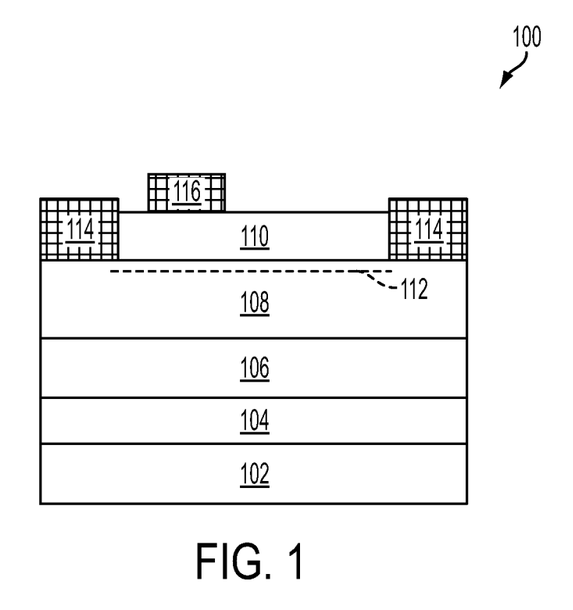
FIG. 1 is a cross-sectional view of a high electron mobility transistor (HEMT) in accordance with one or more embodiments.

FIG. 1 is a cross-sectional view of a high electron mobility transistor (HEMT) 100 in accordance with one or more embodiments. HEMT 100 includes a substrate 102. Substrate 102 has a doped top surface. A nucleation layer 104 is over substrate 102. In some embodiments, nucleation layer 104 includes multiple layers, such as seed layers. A graded layer 106 is over the nucleation layer 104. A channel layer 108 is over graded layer 106. An active layer 110 is over channel layer 108. Due to a band gap discontinuity between channel layer 108 and active layer 110, a two dimension electron gas (2-DEG) 112 is formed in the channel layer near an interface with the active layer. Electrodes 114 are over channel layer 108 and a gate 116 is over active layer 110 between the electrodes.

Substrate 102 acts as a support for HEMT 100. In some embodiments, substrate 102 is a silicon substrate. In some embodiments, substrate 102 includes silicon carbide (SiC), sapphire, or another suitable substrate material. In some embodiments, substrate 102 is a silicon substrate having a (111) lattice structure.

The top surface of substrate 102 is doped with p-type dopants. In some embodiments, the p-type dopants include boron, aluminum, gallium, indium, titanium, boron di-fluoride, combinations thereof, or other suitable p-type dopants. The dopant concentration ranges from about $1 \times 10^{18}$ ions/cm$^3$ to about $1 \times 10^{23}$ ions/cm$^3$. In some embodiments, a depth of an implanted region of substrate 102 ranges from about 0.01 microns (µm) to about 0.5 µm from the top surface of the substrate. In some embodiments, the p-type dopants are implanted using an ion implantation process to implant dopants directly into substrate 102. In some embodiments, the p-type dopants are introduced using a plasma enhanced chemical vapor etching (PECVE) process, a reactive ion etching (RIE) process, or another suitable material removal process to remove a top portion of substrate 102 and then a doped layer is grown over the remaining portion of the substrate. In some embodiments, an anneal process is performed following the introduction of the p-type dopants. In some embodiments, the anneal process is performed at a temperature ranging from about 900° C. to about 1100° C., for a duration up to 60 minutes.

Figure 2:
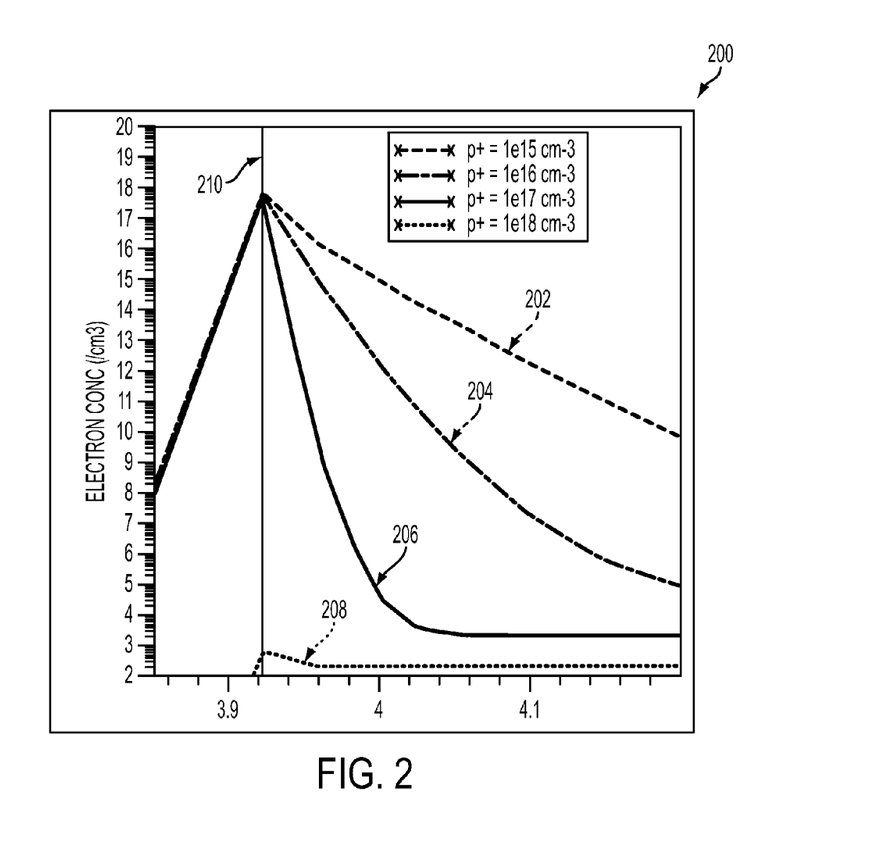
FIG. 2 is a graph of an electron concentration versus a depth in a HEMT in accordance with one or more embodiments.

The introduction of the p-type dopants helps to reduce a concentration of electrons present at the top surface of the substrate. FIG. 2 is a graph 200 of an electron concentration versus a depth in a HEMT in accordance with one or more embodiments. Graph 200 indicates an electron concentration 202 when the p-type dopant concentration is $1 \times 10^{15}$ ions/cm$^3$. Graph 200 indicates an electron concentration 204 when the p-type dopant concentration is $1 \times 10^{16}$ ions/cm$^3$. Graph 200 indicates an electron concentration 206 when the p-type dopant concentration is $1 \times 10^{17}$ ions/cm$^3$. Graph 200 indicates an electron concentration 208 when the p-type dopant concentration is $1 \times 10^{18}$ ions/cm$^3$. At an interface 210 between substrate 102 and nucleation layer 104, graph 200 indicates an electron concentration greater than 17 electrons/cm$^3$, for dopant concentrations ranging from $1 \times 10^{15}$ ions/cm$^3$ to $1 \times 10^{17}$ ions/cm$^3$. In contrast, graph 200 indicates an electron concentration of less than 3 electrons/cm$^3$, where the dopant concentration is $1 \times 10^{18}$ ions/cm$^3$. The lower electron concentration enables a higher voltage to be applied to gate 116 without damaging HEMT 100. In some embodiments, HEMT 100 has a breakdown voltage equal to or greater than about 800 volts (V). As a result, HEMT 100 is able to be used in higher voltage applications in comparison with HEMTs which do not include substrate 102 having a doped top surface, as described above.

Nucleation layer 104 helps to compensate for a mismatch in lattice structures between substrate 102 and graded layer 106. In some embodiments, nucleation layer 104 includes multiple layers. In some embodiments, nucleation layer 104 includes a same material formed at different temperatures. In some embodiments, nucleation layer 104 includes a stepwise change in lattice structure. In some embodiments, nucleation layer 104 includes a continuous change in lattice structure. In some embodiments, nucleation layer 104 is formed by epitaxially growing the nucleation layer on substrate 102.

In at least one example, nucleation layer 104 comprises a first layer of aluminum nitride (AlN) and a second layer of AlN over the first layer of AlN. The first layer of AlN is formed at a high temperature, ranging from about 1000° C. to about 1300° C., and has a thickness ranging from about 50 nanometers (nm) to about 200 nm. If the thickness of the first layer of AlN is too small, subsequent layers formed on the first layer of AlN will experience a high stress at the interface with the first AlN layer due to lattice mismatch increasing a risk of layer separation. If the thickness of the first layer of AlN is too great, the material is wasted and production costs increase. The second layer of AlN is formed at a low temperature, ranging from about 900° C. to about 1000° C., and has a thickness ranging from about 20 nm to about 80 nm. The lower temperature provides a different lattice structure in the second AlN layer in comparison with the first AlN layer. The lattice structure in the second AlN layer is more different from a lattice structure of substrate 102 than the first AlN layer. If the thickness of the second layer of AlN is too small, subsequent layers formed on the second layer of AlN will experience a high stress at the interface with the second layer of AlN due to lattice mismatch increasing the risk of layer separation. If the thickness of the second layer of AlN is too great, the material is wasted and production costs increase.

In some embodiments, nucleation layer 104 is omitted, and thus graded layer 106 is directly on substrate 102.

Graded layer 106 provides additional lattice matching between nucleation layer 104 and channel layer 108. In some embodiments, graded layer 106 is doped with p-type dopants to reduce the risk of electron injection from substrate 102. Electron injection occurs when electrons from substrate 102 diffuse into channel layer 108. By including p-type dopants, the electrons are trapped by the by the positively charged dopants and do not negatively impact performance of 2-DEG 112 in channel layer 108. In some embodiments, the p-type dopant concentration in graded layer 106 is greater than or equal to $1 \times 10^{17}$ ions/cm$^3$. In some embodiments, the p-type dopants include carbon, iron, magnesium, zinc or other suitable p-type dopants. In some embodiments, graded layer 106 includes aluminum gallium nitride ($Al_xGa_{1-x}N$), where x is the aluminum content ratio in the graded layer. In some embodiments, the graded layer includes multiple layers each having a decreased ratio x (from a layer adjoining nucleation layer 104 to a layer that adjoins SLS 108, or from the bottom to the top portions of the graded layer). In some embodiments, graded layer has a thickness ranging from about 550 nm to about 1050 nm. If graded layer 106 is too thin, electrons from substrate 102 will be injected into channel layer 110 at high voltages, negatively impacting 2-DEG 112 or a lattice mismatch between nucleation layer 104 and channel layer 108 will result in a high stress in the channel layer and increase a risk of layer separation. If graded layer 106 is too thick, material is wasted and production costs increase. In some embodiments, the graded layer is formed at a temperature ranging from about 1000° C. to about 1200° C. In some embodiments, a p-type dopant concentration of graded layer 106 increases from a bottom of the graded layer to a top of the graded layer.

In at least one example, graded layer 106 includes three graded layers. A first graded layer adjoins nucleation layer 104. The first graded layer includes $Al_xGa_{1-x}N$, where x ranges from about 0.7 to about 0.9. A thickness of the first graded layer ranges from about 50 nm to about 200 nm. A second graded layer is on the first graded layer. The second graded layer includes $Al_xGa_{1-x}N$, where x ranges from about 0.4 to about 0.6. A thickness of the second graded layer ranges from about 150 nm to about 250 nm. A third graded layer is on the second graded layer. The third graded layer includes $Al_xGa_{1-x}N$, where x ranges from about 0.15 to about 0.3. A thickness of the third graded layer ranges from about 350 nm to about 600 nm.

Channel layer 108 is used to help form a conductive path for selectively connecting electrodes 114. In some embodiments, channel layer 108 has a dopant concentration of p-type dopants of less than or equal to $1 \times 10^{17}$ ions/cm$^3$. In some embodiments, channel layer 108 includes undoped GaN. In some embodiments, channel layer 108 has a thickness ranging from about 0.5 μm to about 5.0 μm. If a thickness of channel layer 108 is too thin, the channel layer will not provide sufficient charge carriers to allow HEMT 100 to function properly. If the thickness of channel layer 108 is too great, material is wasted and production costs increase. In some embodiments, channel layer 108 is formed by an epitaxial process. In some embodiments, channel layer 108 is formed at a temperature ranging from about 1000° C. to about 1200° C.

Active layer 110 is used to provide the band gap discontinuity with channel layer 108 to form 2-DEG 112. In some embodiments, active layer 110 includes AlN. In some embodiments, active layer 110 includes a mixed structure, e.g., $Al_xGa_{1-x}N$, where x ranges from about 0.1 to 0.3. In some embodiments, active layer 110 includes both AlN and the mixed structure. In some embodiments, active layer 110 has a thickness ranging from about 10 nm to about 40 nm. In some embodiments where active layer 110 includes an AlN layer and a mixed structure layer, a thickness of the AlN layer ranges from about 0.5 nm to about 1.5 nm and a thickness of the mixed structure layer ranges from about 10 nm to about 40 nm. If active layer 110 is too thick, selectively controlling the conductivity of the channel layer is difficult. If active layer 110 is too thin, an insufficient amount of electrons are available for 2-DEG 112. In some embodiments, active layer 110 is formed using an epitaxial process. In some embodiments, active layer 110 is formed at a temperature ranging from about 1000° C. to about 1200° C.

2-DEG 112 acts as the channel for providing conductivity between electrodes 114. Electrons from a piezoelectric effect in active layer 110 drop into channel layer 108, and thus create a thin layer of highly mobile conducting electrons in the channel layer.

Electrodes 114 act as a source and a drain for HEMT 100 for transferring a signal into or out of the HEMT. Gate 116 helps to modulate conductivity of 2-DEG 112 for transferring the signal between electrodes 114.

HEMT 100 is normally conductive meaning that a positive voltage applied to gate 116 will reduce the conductivity between electrodes 114 along 2-DEG 112.

Figure 3:
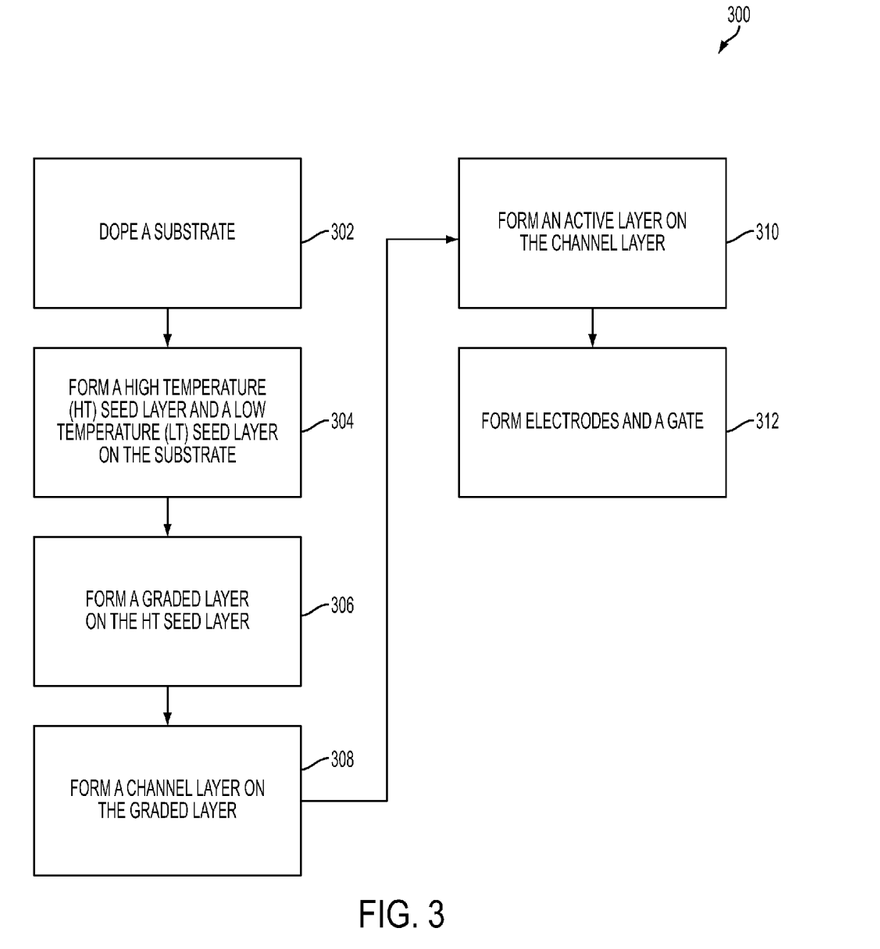
FIG. 3 is a flow chart of a method of making an HEMT in accordance with one or more embodiments.

FIG. 3 is a flow chart of a method 300 of making an HEMT in accordance with one or more embodiments. Method 300 begins with operation 302 in which a substrate is doped. In some embodiments, the substrate is doped by ion implantation. In some embodiments, a doped layer is formed over the substrate by using a PECVE, RIE or other suitable material removal process to remove a portion of the substrate and then epitaxially grow a doped layer on the remaining portion of the substrate.

Figure 4:
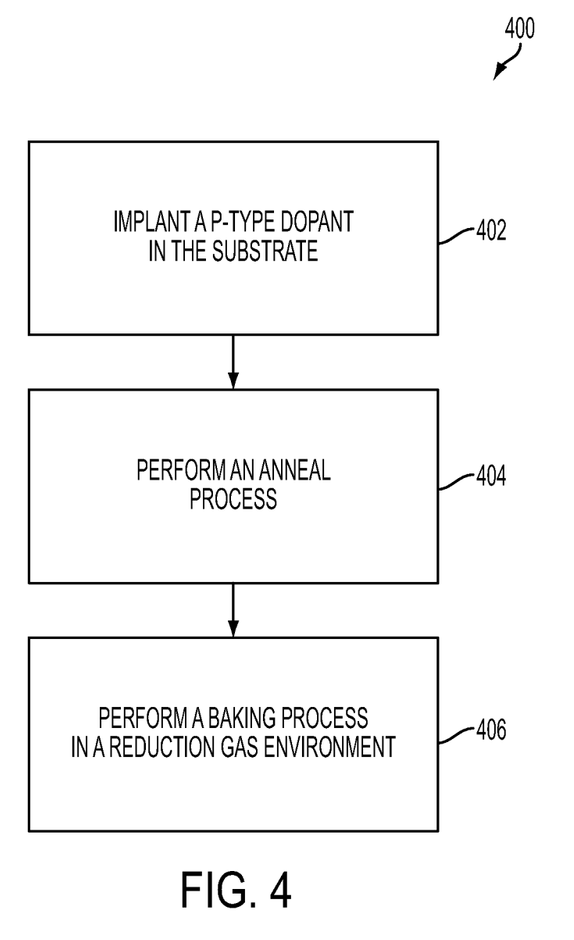
FIG. 4 is a flow chart of a method of doping a substrate in accordance with one or more embodiments.

FIG. 4 is a flow chart of a method 400 of doping a substrate in accordance with one or more embodiments. Method 400 begins with operation 402 in which dopants are implanted in the substrate. The dopants are p-type dopants. In some embodiments, the dopants include boron, aluminum, gallium, indium, titanium, boron di-fluoride or other suitable p-type dopants. In some embodiments, an energy of the implantation process ranges from about 30 kilo electronvolts (keV) to about 100 keV; and a depth to which the dopants are implanted ranges from about 0.01 µm to about 0.5 µm. In some embodiments, a tilt angle of the implantation process ranges from about 5-degrees to about 10-degrees. The implantation process continues until the dopant concentration in the substrate reaches about $1\times10^{18}$ ions/cm$^3$ to about $1\times10^{23}$ ions/cm$^3$.

In operation 404, the doped substrate is subjected to an anneal process. A temperature of the anneal process ranges from about 900° C. to about 1100° C. In some embodiments, a duration of the anneal process is up to 60 minutes. The anneal process helps to diffuse the dopants through the substrate. In some embodiments, operation 404 is omitted and the doped substrate is not subjected to an anneal process.

In operation 406, the doped substrate is subjected to a baking process in a reduction gas environment. In some embodiments, the reduction gas environment contains ionized hydrogen gas, a hydrogen-containing gas or another suitable reduction gas. In some embodiments, the hydrogen is ionized by a plasma process such as in-situ plasma or remote plasma. A temperature of the baking process ranges from about 900° C. to about 1100° C. In some embodiments, a duration of the baking process is up to 3 minutes. The baking process helps to reduce oxides formed on the substrate using a reduction reaction. In some embodiments, operations 404 and 406 are performed simultaneously.

Returning to FIG. 3, method 300 continues with operation 304 in which a low temperature (LT) seed layer and a high temperature (HT) seed layer are formed on a substrate, e.g., substrate 102. The HT seed layer is formed on the substrate and the LT seed layer is formed on the HT seed layer.

In some embodiments, LT seed layer and HT seed layer include AlN. In some embodiments, the formation of LT seed layer and HT seed layer are performed by an epitaxial growth process. In some embodiments, the epitaxial growth process includes a metal-organic chemical vapor deposition (MOCVD) process, a molecular beam epitaxy (MBE) process, a hydride vapor phase epitaxy (HVPE) process or another suitable epitaxial process. In some embodiments, the MOCVD process is performed using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the LT seed layer or the HT seed layer includes a material other than AlN. In some embodiments, the HT seed layer has a thickness ranging from about 50 nm to about 200 nm. In some embodiments, the HT seed layer is formed at a temperature ranging from about 1000° C. to about 1300° C. In some embodiments, the LT seed layer had a thickness ranging from about 20 nm to about 80 nm. In some embodiments, the LT seed layer is formed at a temperature ranging from about 900° C. to about 1000° C.

Method 300 continues with operation 306 in which a graded layer is formed on the LT seed layer. In some embodiments, the graded layer includes an aluminum-gallium nitride ($Al_xGa_{1-x}N$) layer. In some embodiments, the graded aluminum gallium nitride layer has two or more aluminum-gallium nitride layers each having a different ratio x decreased from the bottom to the top. In some embodiments, each of the two or more aluminum-gallium nitride layers is formed by performing an epitaxial process. In some embodiments, the epitaxial process includes a MOCVD process, a MBE process, a HVPE process or another suitable epitaxial process. In some embodiments, the MOCVD process uses an aluminum-containing precursor, a gallium-containing precursor, and a nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In some embodiments, the graded aluminum gallium nitride layer has a continuous gradient of the ratio x gradually decreased from the bottom to the top. In some embodiments, x ranges from about 0.5 to about 0.9. In some embodiments, the graded layer is formed at a temperature ranging from about 1000° C. to about 1200° C. In some embodiments, the graded layer is doped with p-type dopants, such as carbon, iron, magnesium, zinc or other suitable p-type dopants.

In at least one embodiment, a first graded layer is formed on the LT seed layer. The first graded layer adjoins nucleation layer 104. The first graded layer includes $Al_xGa_{1-x}N$, where x ranges from about 0.7 to about 0.9. A thickness of the first graded layer ranges from about 50 nm to about 200 nm. In some embodiments, the first graded layer is formed using epitaxy. In some embodiments, the first graded layer is formed at a temperature ranging from about 1000° C. to about 1200° C. A second graded layer is formed on the first graded layer. The second graded layer includes $Al_xGa_{1-x}N$, where x ranges from about 0.4 to about 0.6. A thickness of the second graded layer ranges from about 150 nm to about 250 nm. In some embodiments, the second graded layer is formed using epitaxy. In some embodiments, the second graded layer is formed at a temperature ranging from about 1000° C. to about 1200° C. A third graded layer is formed on the second graded layer. The third graded layer includes $Al_xGa_{1-x}N$, where x ranges from about 0.15 to about 0.3. A thickness of the third graded layer ranges from about 350 nm to about 600 nm. In some embodiments, the third graded layer is formed using epitaxy. In some embodiments, the third graded layer is formed at a temperature ranging from about 1000° C. to about 1200° C.

Figure 5A:
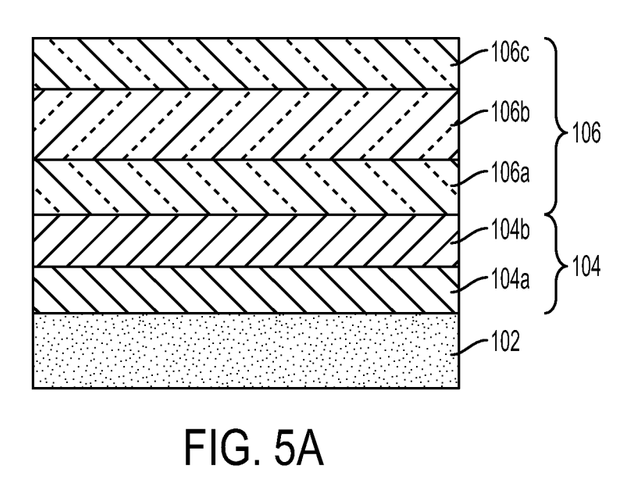
FIGS. 5A-5C are cross-sectional view of a HEMT at various stages of production in accordance with one or more embodiments.

FIG. 5A is a cross-sectional view of a HEMT following operation 306 and method 400. The HEMT includes nucleation layer 104 on substrate 102. Nucleation layer 104 includes a HT seed layer 104a on substrate 102 and a LT seed layer 104b on the HT seed layer. Graded layer 106 is on nucleation layer 104. Graded layer 106 includes a first graded layer 106a on LT seed layer 104b. Graded layer 106 further includes a second graded layer 106b on first graded layer 106a, and a third graded layer 106c on the second graded layer. For the same of simplicity, nucleation layer 104 and graded layer 106 are shown as single layer in the remaining cross-sectional views.

Returning to FIG. 3, in operation 308a channel layer is formed on the graded layer. In some embodiments, the channel layer includes p-type dopants. In some embodiments, the channel layer includes GaN, and the P-type doping is implemented by using dopants including carbon, iron, magnesium, zinc or other suitable p-type dopants. In some embodiments, the channel layer is formed by performing an epitaxial process. In some embodiments, the epitaxial process includes a MOCVD process, a MBE process, a HVPE process or another suitable epitaxial process. In some embodiments, the channel layer has a thickness ranging from about 0.2 μm to about 1.0 μm. In some embodiments, the dopant concentration in the channel layer is equal to or less than about $1 \times 10^{17}$ ions/cm³. In some embodiments, the channel layer is undoped. In some embodiments, the channel layer is formed at a temperature ranging from about 1000° C. to about 1200° C.

Figure 5B:
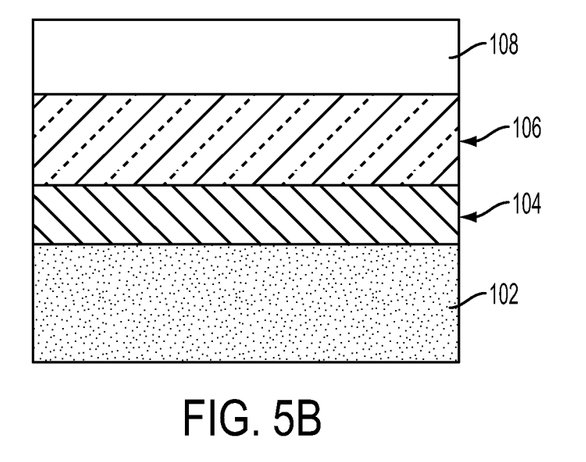

FIG. 5B is a cross-sectional view of the HEMT following operation 308 in accordance with one or more embodiments. The HEMT includes channel layer 108 on graded layer 106.

Returning to FIG. 3, in operation 310 an active layer is formed on the channel layer. In some embodiments, the active layer includes AlN, $Al_xGa_{1-x}N$, combinations thereof or other suitable materials. In some embodiments, x ranges from about 0.1 to about 0.3. In some embodiments, the active layer is formed by performing an epitaxial process. In some embodiments, the epitaxial process includes a MOCVD process, a MBE process, a HVPE process or another suitable epitaxial process. In some embodiments, the active layer has a thickness ranging from about 10 nm to about 40 nm. In some embodiments where the active layer includes both AlN and $Al_xGa_{1-x}N$, the AlN layer has a thickness ranging from about 0.5 nm to about 1.5 nm and the $Al_xGa_{1-x}N$ layer has a thickness ranging from about 10 nm to about 40 nm. In some embodiments, the active layer is formed at a temperature ranging from about 1000° C. to about 1200° C.

Figure 5C:
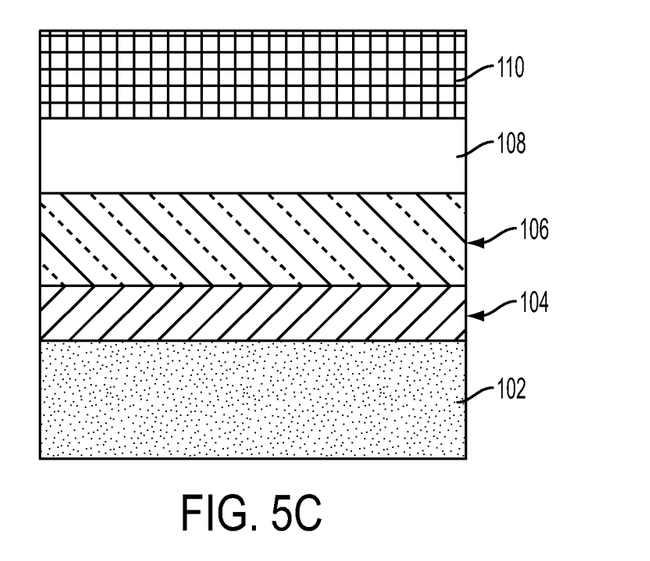

FIG. 5C is a cross-sectional view of the HEMT following operation 310 in accordance with one or more embodiments. The HEMT includes active layer 110 on channel layer 108. 2-DEG 112 is formed in channel layer 108 due to the band gap discontinuity between active layer 110 and the channel layer.

Returning to FIG. 3, in operation 312 electrodes and a gate are formed on the active layer. The electrodes are formed over the other portion of the channel layer, and the gate is formed over the active layer. In some embodiments, a patterned mask layer (i.e., a photoresistive layer) is formed on the upper surface of the active layer, and an etching process is performed to remove a portion of the active layer to form openings partially exposing an upper surface of the other portion of the channel layer. A metal layer is then deposited over the patterned active layer and fills the openings and contacts the other portion of the channel layer. Another patterned photoresist layer is formed over the metal layer, and the metal layer is etched to form the electrodes over the openings and the gate over the upper surface of the active layer. In some embodiments, the metal layer for forming the electrodes or the gate includes one or more conductive materials. In some embodiments, the electrodes or the gate include one or more layers of conductive materials. In at least one embodiment, the electrodes or the gate include at least one barrier layer contacting the other portion of the channel layer and/or the active layer.

Following operation 312 the HEMT has a similar structure to HEMT 100.

Figure 6:
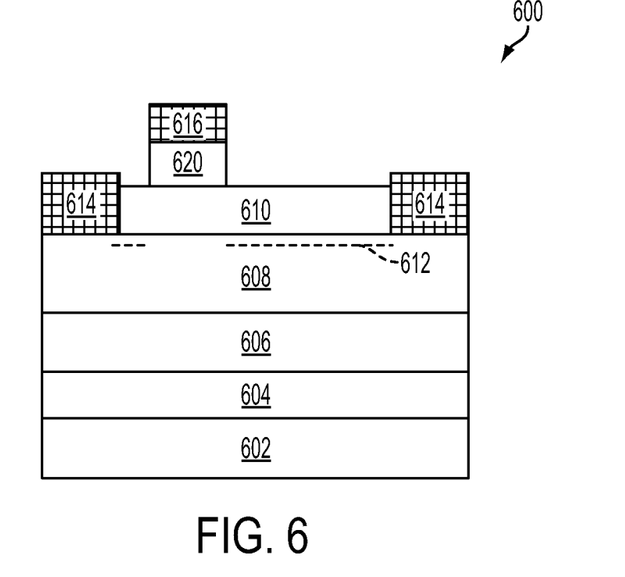
FIG. 6 is a cross-sectional view of an enhanced HEMT (E-HEMT) in accordance with one or more embodiments.

FIG. 6 is a cross-sectional view of an enhanced HEMT (E-HEMT) 600 in accordance with one or more embodiments. E-HEMT 600 is similar to HEMT 100. Similar elements have a same reference number as HEMT 100 increased by 500. In comparison with HEMT 100, E-HEMT 600 includes a semiconductor material 620 between gate 616 and active layer 610. In some embodiments, semiconductor material 620 is a group III-V semiconductor material such as GaN, AlGaN, InGaN, or another suitable group III-V semiconductor material. In some embodiments, semiconductor material 620 is doped with p-type or n-type dopants. In some embodiments, the p-type dopants include carbon, iron, magnesium, zinc or other suitable p-type dopants. In some embodiments, the n-type dopants include silicon, oxygen or other suitable n-type dopants. In comparison with HEMT 100, E-HEMT 600 is normally non-conductive between electrodes 614. As a positive voltage is applied to gate 616, E-HEMT 600 provides an increased conductivity between electrodes 614.

Figure 7:
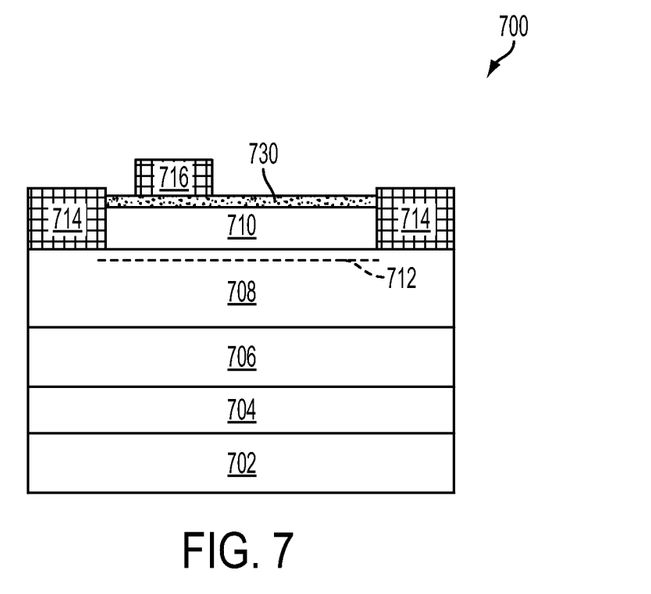
FIG. 7 is a cross-sectional view of a depletion metal-insulator-semiconductor field-effect transistor (D-MISFET) in accordance with one or more embodiments.

FIG. 7 is a cross-sectional view of a depletion metal-insulator-semiconductor field-effect transistor (D-MISFET) 700 in accordance with one or more embodiments. D-MISFET 700 is similar to HEMT 100. Similar elements have a same reference number as HEMT 100 increased by 600. In comparison with HEMT 100, D-MISFET 700 includes a dielectric layer 730 between gate 716 and active layer 710. In some embodiments, dielectric layer 730 includes silicon dioxide. In some embodiments, dielectric layer 730 includes a high-k dielectric layer having a dielectric constant greater than a dielectric constant of silicon dioxide. Similar to HEMT 100, D-MISFET 700 is normally conductive between electrodes 714. As a positive voltage is applied to gate 716, D-MISFET 700 provides a decreased conductivity between electrodes 714.

Figure 8:
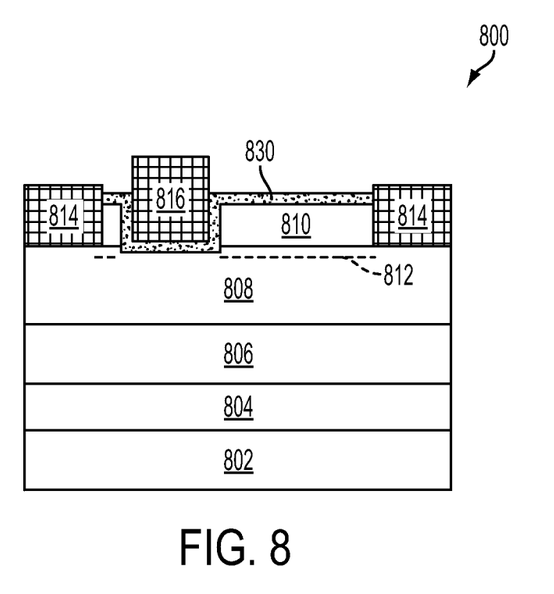
FIG. 8 is a cross-sectional view of an enhanced metal-insulator-semiconductor field-effect transistor (E-MISFET) in accordance with one or more embodiments.

FIG. 8 is a cross-sectional view of an enhanced metal-insulator-semiconductor field-effect transistor (E-MISFET) 800 in accordance with one or more embodiments. E-MISFET 800 is similar to HEMT 100. Similar elements have a same reference number as HEMT 100 increased by 700. In comparison with HEMT 100, E-MISFET 800 gate 816 is in contact with channel layer 810 without intervening active layer 810. E-MISFET 800 further includes a dielectric layer 840 between gate 816 and channel layer 810. Dielectric layer 840 also separates sidewalls of gate 816 and active layer 810. In some embodiments, dielectric layer 840 includes silicon dioxide. In some embodiments, dielectric layer 840 includes a high-k dielectric layer having a dielectric constant greater than a dielectric constant of silicon dioxide. In comparison with HEMT 100, E-MISFET 800 is normally non-conductive between electrodes 814. As a positive voltage is applied to gate 816, E-MISFET 800 provides an increased conductivity between electrodes 814.

One aspect of this description relates to a transistor. The transistor includes a substrate, wherein a top portion of the substrate is doped with p-type dopants to a dopant concentration ranging from about $1\times10^{18}$ ions/cm$^3$ to about $1\times10^{23}$ ions/cm$^3$. The transistor further includes a graded layer on the substrate and a channel layer on the graded layer. The transistor further includes an active layer on the channel layer, wherein the active layer has a band gap discontinuity with the channel layer.

Another aspect of this description relates to a transistor. The transistor includes a substrate, wherein a top portion of the substrate is doped with p-type dopants to a dopant concentration ranging from about $1\times10^{18}$ ions/cm$^3$ to about $1\times10^{23}$ ions/cm$^3$, a depth of the top portion ranges from about 0.01 microns (μm) to about 0.5 μm. The transistor further includes a graded layer on the substrate and a channel layer on the graded layer. The transistor further includes an active layer on the channel layer, wherein the active layer has a band gap discontinuity with the channel layer, wherein the transistor has a breakdown voltage of at least 800 volts (V).

Still another aspect of this description relates to a method of making a transistor. The method includes doping a substrate with p-type dopants to form a top portion of the substrate having a dopant concentration ranging from about $1\times10^{18}$ ions/cm$^3$ to about $1\times10^{23}$ ions/cm$^3$. The method further includes forming a graded layer on the doped substrate and forming a channel layer on the graded layer. The method further includes forming an active layer on the channel layer, wherein the active layer has a band gap discontinuity with the channel layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A transistor comprising:
    a substrate, wherein a top portion of the substrate is doped with p-type dopants to a dopant concentration of at least about $1\times10^{18}$ ions/cm$^3$;
    a graded layer on the substrate;
    a channel layer on the graded layer; and
    an active layer on the channel layer, wherein the active layer has a band gap discontinuity with the channel layer.

2. The transistor of claim 1, wherein a depth of the top portion ranges from about 0.01 microns (μm) to about 0.5 μm.

3. The transistor of claim 1, wherein the transistor has a breakdown voltage of at least 800 volts (V).

4. The transistor of claim 1, wherein the graded layer comprises:
    a first graded layer including $Al_xGa_{1-x}N$, where x ranges from 0.7 to 0.9;
    a second graded layer on the first graded layer, the second graded layer including $Al_yGa_{1-y}N$, where y ranges from 0.4 to 0.6; and
    a third graded layer on the second graded layer, the third graded layer including $Al_zGa_{1-z}N$, where z ranges from 0.15 to 0.3.

5. The transistor of claim 4, wherein a thickness of the first graded layer ranges from about 50 nanometers (nm) to about 200 nm.

6. The transistor of claim 4, wherein a thickness of the second graded layer ranges from about 150 nm to about 250 nm.

7. The transistor of claim 4, wherein a thickness of the third graded layer ranges from about 350 nm to about 600 nm.

8. The transistor of claim 1, wherein the channel layer is undoped.

9. The transistor of claim 1, further comprising:
    a first electrode on the channel layer;
    a second electrode on the channel layer; and
    a gate between the first electrode and the second electrode, wherein the gate is configured to control a conductivity of the 2-DEG between the first electrode and the second electrode.

10. The transistor of claim 9, wherein the gate is on the active layer, and the transistor is configured to be normally conductive.

11. The transistor of claim 9, further comprising a semiconductor material on the active layer between the first electrode and the second electrode, wherein the gate is on the semiconductor material and the transistor is configured to be normally non-conductive.

12. The transistor of claim 9, further comprising a dielectric layer on the active layer between the first electrode and the second electrode, wherein the gate is on the dielectric layer, and the transistor is configured to be normally conductive.

13. The transistor of claim 9, wherein the active layer has an opening therein between the first electrode and the second electrode and the transistor further comprising:
    a dielectric layer on the active layer and lining the opening, wherein the gate is on the dielectric layer in the opening, and the transistor is configured to be normally non-conductive.

14. The transistor of claim 1, further comprising a nucleation layer between the substrate and the graded layer.

15. A transistor comprising:
    a substrate, wherein a top portion of the substrate is doped with p-type dopants to a dopant concentration of at least about $1\times10^{18}$ ions/cm$^3$, a depth of the top portion ranges from about 0.01 microns (μm) to about 0.5 μm;
    a graded layer on the substrate;
    a channel layer on the graded layer; and
    an active layer on the channel layer, wherein the active layer has a band gap discontinuity with the channel layer, wherein the transistor has a breakdown voltage of at least 800 volts (V).

16. A method of making a transistor, the method comprising:
    doping a substrate with p-type dopants to form a top portion of the substrate having a dopant concentration of at least about $1\times10^{18}$ ions/cm$^3$;
    forming a graded layer on the doped substrate;
    forming a channel layer on the graded layer; and
    forming an active layer on the channel layer, wherein the active layer has a band gap discontinuity with the channel layer.

17. The method of claim 16, wherein doping the substrate comprises doping the substrate using an implantation process, wherein the implantation process is performed at a power ranging from about 30 kilo electronvolts (keV) to about 100 keV, and at a tilt angle ranging from about 5-degrees to about 10-degrees.

18. The method of claim 16, further comprising annealing the doped substrate at a temperature ranging from about 900° C. to about 1100° C.

19. The method of claim 16, further comprising performing a baking process on the doped substrate in a reduction gas environment.

20. The method of claim 19, wherein performing the baking process comprises baking the substrate at a temperature ranging from about 900° C. to about 1100° C. in the presence of a hydrogen-containing gas.

\* \* \* \* \*